United States Patent [19]
Henderson et al.

[11] Patent Number: 5,455,440
[45] Date of Patent: Oct. 3, 1995

[54] METHOD TO REDUCE EMITTER-BASE LEAKAGE CURRENT IN BIPOLAR TRANSISTORS

[75] Inventors: Timothy S. Henderson; Shou-kong Fan, both of Richardson; William U. Liu, Dallas, all of Tex.

[73] Assignee: Texas Instruments Incorporated, Dallas, Tex.

[21] Appl. No.: 245,712

[22] Filed: May 17, 1994

Related U.S. Application Data

[63] Continuation of Ser. No. 988,055, Dec. 9, 1992, abandoned.
[51] Int. Cl.$^6$ .................... H01L 21/8222; H01L 29/737
[52] U.S. Cl. .................... 257/198; 257/197; 257/773; 257/776
[58] Field of Search .................... 257/776, 197, 257/198, 773

[56] References Cited

U.S. PATENT DOCUMENTS 4,965,650  10/1990  Inada et al. .................... 257/198
5,016,065   5/1991  Seki et al. .................... 257/201
5,041,882   8/1991  Katoh .................... 257/201
5,064,772  11/1991  Jambotkar .................... 257/197

FOREIGN PATENT DOCUMENTS 2721744  12/1977  Germany .................... 257/198

*Primary Examiner*—Jerome Jackson
*Attorney, Agent, or Firm*—Michael K. Skrehot; James C. Kesterson; Richard L. Donaldson

[57] ABSTRACT

Generally, and in one form of the invention, a method is disclosed for reducing base-to-emitter leakage in a bipolar transistor having an active region 22 bounded by an isolation implant boundary 24, said method comprising arranging an emitter contact 26 and a base contact 36 such that at a crossing of the contacts over the implant boundary, a leakage current between the contacts along the boundary is limited by a necessity to transit the thickness of a layer of material, and whereby said transistor exhibits improved gain, noise performance, and reliability.

16 Claims, 4 Drawing Sheets

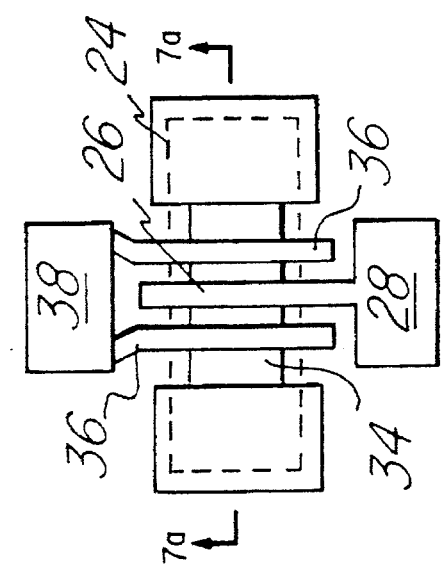
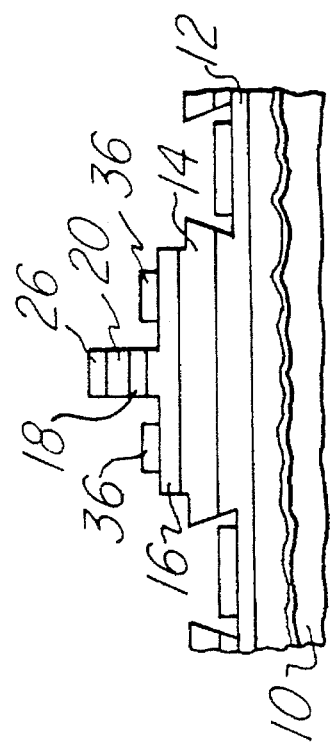
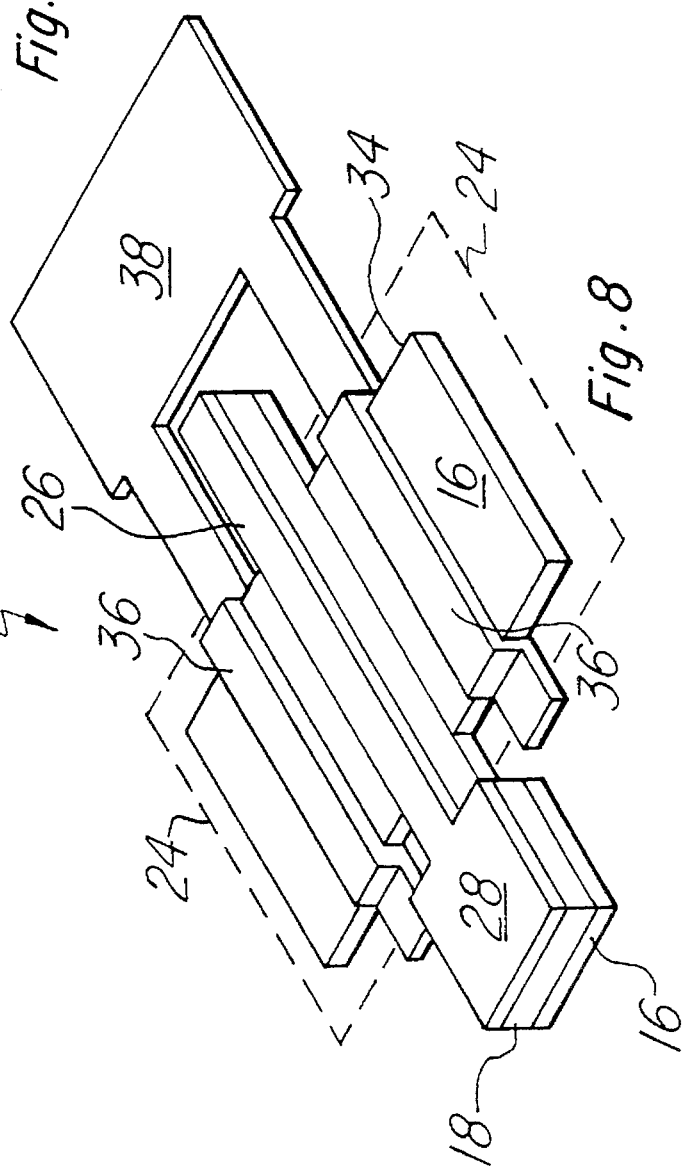

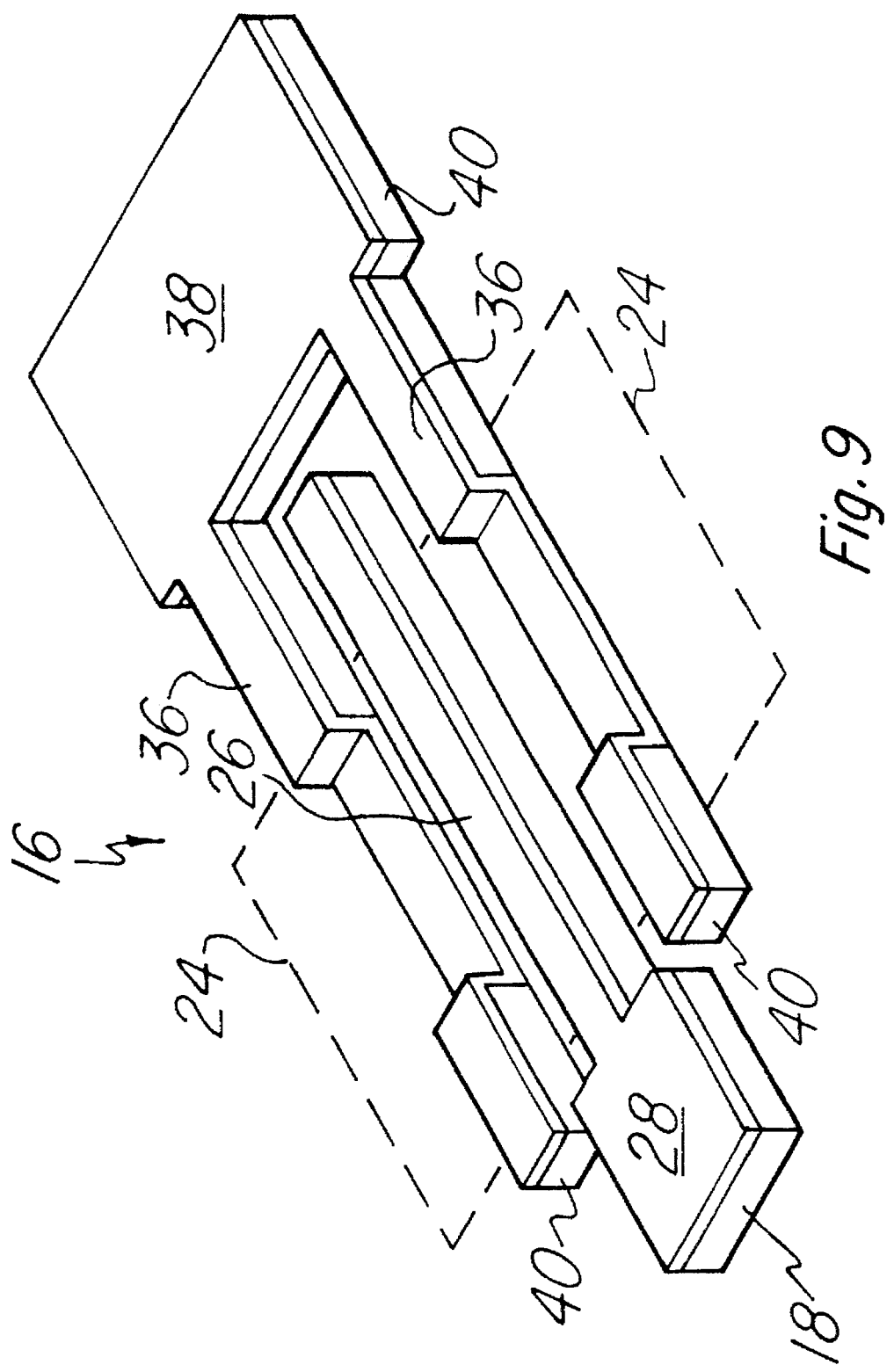

METHOD TO REDUCE EMITTER-BASE LEAKAGE CURRENT IN BIPOLAR TRANSISTORS

This application is a Continuation of application Ser. No. 07/988,055, filed Dec. 9, 1992, now abandoned.

FIELD OF THE INVENTION

This invention relates generally to methods for reducing emitter-base leakage current in bipolar transistors.

BACKGROUND OF THE INVENTION

Without limiting the scope of the invention, its background is described in connection with heterojunction bipolar transistors, as an example.

Heretofore in this field heterojunction bipolar transistors (HBTs) have attracted a great deal of interest for their potential in both microwave and digital applications. HBT structures have a heterojunction at the emitter-base junction which enables the current gain of the device to be almost independent of epitaxial layer doping concentrations. HBTs can thus be readily optimized for high-speed or high frequency operation by selecting appropriate layer properties, in contrast to typical silicon homojunction bipolar transistors. Although it is very important to minimize transit times and parasitic resistive elements within the active device, high performance operation also demands a minimization of all parasitic external device capacitances. Parasitic elements such as the capacitance between contact pads of the emitter, base, and collector electrodes, as well as the parallel-plate capacitance between emitter or base contact pads and the buried subcollector, must be minimized.

Due to its excellent semi-insulating properties, a GaAs substrate can easily isolate the device contact pads from the ground plane. However, the interelectrode isolation requires either ion implantation or mesa etching to reduce the conductivity of layers beneath the contact metals. Both techniques are commonly used in GaAs devices and are applicable to HBTs as well. Although mesa etching is intuitively the simplest way to achieve isolation, it results in non-planar device topography and limits the potential complexity of circuits. Ion implantation has been applied successfully to HBT fabrication and has shown greater potential for integrated circuits due to resulting planar or quasi-planar surfaces. Proton, oxygen, proton and oxygen, and boron implants have been used in the past. Although implantation is the preferred isolation technique, it can have a deleterious effect on the DC and 1/f noise characteristics of a device depending on process flow, device structure and the type of implant used.

SUMMARY OF THE INVENTION

It has been found that even though the implant isolation is generally insulative, the crossing of base and emitter contact lines of an HBT directly on the boundary of an implant isolation allows for a significantly increased leakage current between the contacts, most likely because of charge traps resulting from ion bombardment of the semiconductor lattice. This current reduces device current gain, increases device noise, and may be a source of reliability problems. Therefore, there is a need for an HBT structure that reduces the emitter-base leakage current.

In one form of the invention, a method is disclosed for reducing base-to-emitter leakage in a bipolar transistor having an active region bounded by an isolation implant boundary, said method comprising arranging an emitter contact and a base contact such that at a crossing of the contacts over the implant boundary, a leakage current between the contacts along the boundary is limited by a necessity to transit the thickness of a layer of material, and whereby said transistor exhibits improved gain, noise performance, and reliability.

In another form of the invention, a bipolar transistor is disclosed comprising: a substrate comprising; a semiconductor collector layer, a semiconductor base layer, a semiconductor emitter layer; a first active region created in the substrate by ion implanting to convert all regions of semiconducting material outside of the first active region to substantially insulating material; an emitter contact comprising a strip of metallization deposited over the emitter layer, the base layer, and the collector layer, the contact crossing over a boundary of the first active region; a second active region created within the first active region by removing the emitter layer from all areas not covered by the emitter metallization, and then by removing the base layer from all areas except that covered by the emitter metallization and in an area within the first active region; a base contact comprising a strip of metallization deposited on the base layer within the second active region and on the collector layer outside of the second active region, wherein any leakage current from the base contact to the emitter contact along the border of the first active region must go through the base layer.

In still another form of the invention, a bipolar transistor is disclosed comprising: a substrate comprising; a semiconductor collector layer, a semiconductor base layer, a semiconductor emitter layer; a first active region created in the substrate by ion implanting to convert all regions of semiconducting material outside of the first active region to substantially insulating material; an emitter contact lying primarily within, but also crossing a boundary of the first active region, wherein the emitter contact comprises a strip of metallization deposited over the emitter layer, the base layer, and the collector layer within the first active region, and over the emitter layer, the base layer, the collector layer, and an insulator layer at the boundary of the first active region; a base contact lying primarily within, but also having a crossing of the boundary of the first active region, wherein the base contact comprises a strip of metallization deposited on the base layer, and wherein any leakage current from the base contact to the emitter contact along the boundary of the first active region must go through the insulator layer.

An advantage of the invention is that it significantly reduces base-emitter leakage current without added processing complexity. The invention may also be easily implemented in only one additional process step and does not appreciably alter high frequency device response.

BRIEF DESCRIPTION OF THE DRAWINGS

In the drawings:

FIGS. 1a–7a are cross sectional views showing a first preferred embodiment structure at various stages of completion;

FIGS. 1b–7b are top views of a first preferred embodiment structure and correspond to the cross-sectional views of FIGS. 1a–7a;

FIG. 8 is a perspective view of a first preferred embodiment;

FIG. 9 is a perspective view of a second preferred embodiment.

DETAILED DESCRIPTION OF PREFERRED EMBODIMENTS

Figure 1A:
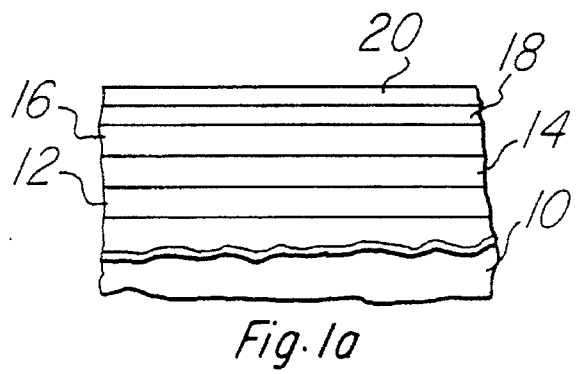

With reference to FIGS. 1–8, a first preferred embodiment of the invention is described hereinbelow. The embodiment is constructed of an epitaxial material structure, shown in FIG. 1a, grown by MOCVD, MBE or a similar method. The material structure is comprised of: a semi-insulating substrate 10, of GaAs for example, but may alternately be of a material such as InP; followed by a heavily doped (about $1\times10^{18}$ cm$^{-3}$), approximately 1.0 μm thick subcollector layer 12 of GaAs for example, but may alternately be of any material that is lattice matched to the substrate 10; followed by a collector layer 14, of GaAs for example, but may alternately be of a material such as $Ga_yIn_{1-y}P$ (where y is approximately 0.5), doped at approximately $1\times10^{16}$ cm$^{-3}$ and having a thickness of approximately 1.0 μm; followed by an approximately 800 Angstrom thick base layer 16, of GaAs for example, but may alternately be of $In_zGa_{1-z}As$ (where z is approximately 0.53), doped with C for example to approximately $3\times10^{19}$ cm$^{-3}$; followed by an emitter layer 18, of $Al_xGa_{1-x}As$ (where x is approximately 0.3) for example, or may alternately be of another wide bandgap material such as $Ga_yIn_{1-y}P$ (where y is approximately 0.5), doped to a concentration of approximately $3\times10^{17}$ cm$^{-3}$ and having a thickness in the range of approximately 500 to 1000 Angstroms, but preferably about 500 Angstroms. The Al content of the AlGaAs is then graded to zero over a thickness of approximately 500 Angstroms to a cap layer 20 approximately 0.15 μm in thickness that is heavily doped at greater than about $2\times10^{18}$ cm$^{-3}$. A layer of InGaAs is commonly grown on GaAs layer 20 to facilitate contact to the structure.

This embodiment is an NPN HBT with the preferred dopant for the subcollector 12, collector 14, emitter 18, and emitter cap 20 layers being Si, with possible alternatives including Sn and Te. The preferred dopant for the base layer 16 is C, with possible alternatives including Zn and Cd.

Figure 1B:
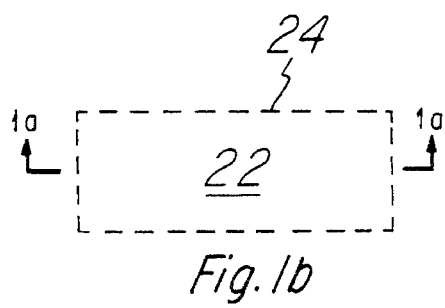
Figure 2A:
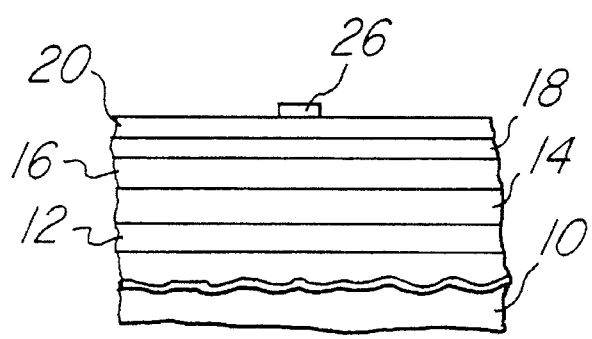
Figure 2B:
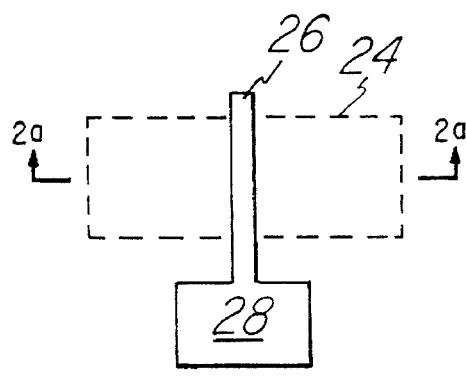
Figure 3A:
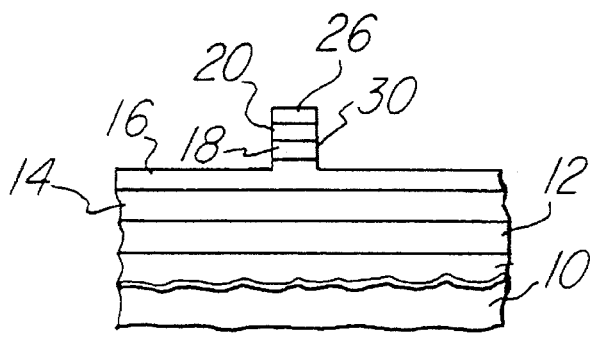
Figure 3A:
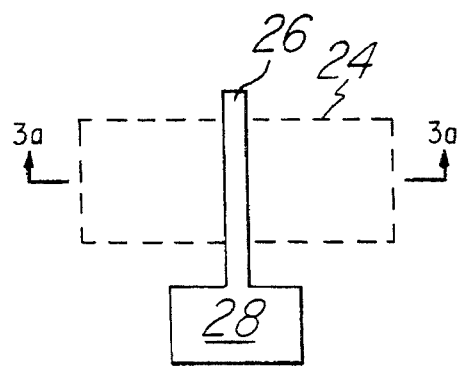

An isolation ion implantation procedure using a combination of O, Ga, and B ions is then performed to form active region 22, bounded by implant boundary 24 outside of which the epitaxial material structure is converted to a semi-insulating state by the implant procedure. FIG. 1b is a top view of the epitaxial material structure showing the general shape of the active region 22.

Emitter metal consisting of AuGe/Ni/Au, for example, in respective thicknesses of approximately 500/140/3000 Angstroms is then deposited on the epitaxial material structure. This emitter metal forms emitter contact 26 and emitter pad 28 on emitter cap layer 20. Emitter cap layer 20 and emitter layer 18 are then etched away using reactive ion etching from areas not covered by emitter metallization, leaving the emitter mesa 30 shown in FIG. 3a.

Figure 4A:
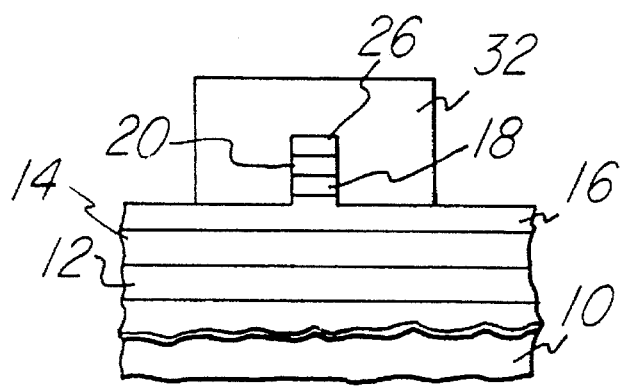
Figure 4B:
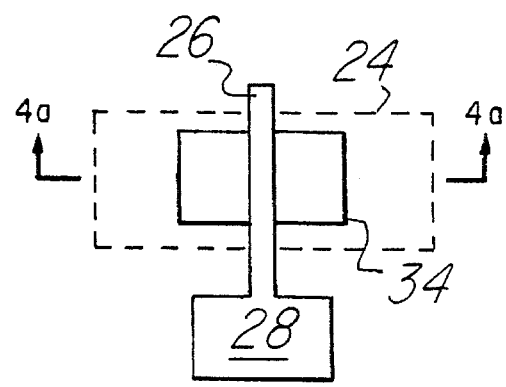

Photoresist 32 is then deposited over emitter mesa 30 to define a second active region 34 shown in FIG. 4b, which is a top view of FIG. 4a. A reactive ion etch using $BCl_3$ as the reactant is then performed to remove portions of base layer 16 not covered by photoresist 32. This etching defines a base mesa (see FIGS. 5a and 5b) sharing the same boundary of the abovementioned second active region 34. It also leaves the lightly doped collector layer 14 exposed outside of the second active region.

Figure 6A:
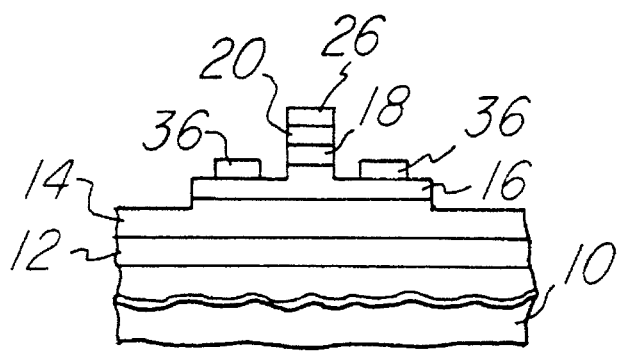
Figure 6B:
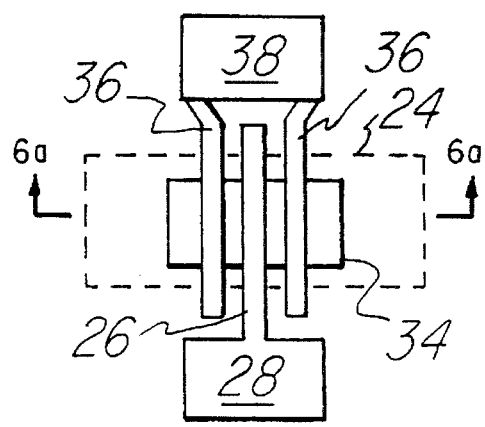

Base metal, Ti/Pt/Au, for example in respective thicknesses of approximately 500/150/1500 Angstroms, is then deposited generally as shown in FIG. 6a and 6b to form base contacts 36 and base pad 38. Contact to subcollector layer 12 is achieved using standard etch and metallization techniques and results in the structure as shown in FIG. 7a and 7b.

FIG. 8 is a perspective view of the structure shown generally in FIGS. 6a and 6b. One can see that at its crossing of implant boundary 24, base contact 36 is in contact with collector layer 14. Thus the portions of base contact 16 at the boundary 24 and outside of this boundary are separated from the emitter mesa, comprised of base layer 16, emitter layer 18, and emitter cap layer 20 (not shown for clarity) underneath emitter contact metallization 26 and emitter pad 28, by a distance of lightly doped collector layer 14. In prior art devices, the base contact crosses the implant boundary on the relatively highly doped base layer 16. Leakage due to traps induced by lattice damage in the isolation implant forms a leakage path for current to flow from base-to-emitter or vice versa. Having one contact on a lightly doped or semi-insulating surface such as collector layer 14 lowers the number of carriers available for conduction along the implant boundary leakage path. In addition, placing the base contact on the collector layer forces any leakage current to vertically transit the thickness of base layer 16, as well as the base-emitter junction, before reaching emitter layer 18. Thus the leakage current is substantially reduced by the sheet resistivity of the base layer 16. This structure also has the advantage that the emitter pad 28 and collector pad 38 are on the lightly doped collector layer 14 rather than the more heavily doped base layer 16. This is believed to help limit base-emitter leakage current also.

The collector capacitance and base-collector junction characteristics may be affected by the base metal running over a short length of non-implanted collector layer 14 (between the second active region 34 and the isolation boundary 24). These problems may be reduced by one of the following: a) doping the collector as lowly as possible, b) placing an undoped layer at the base-collector interface, or c) using a low temperature nitride or oxide deposition, then lifting off with photoresist after the etch to form the second active region 34. In general, the parasitic capacitances and resistances of the bipolar device are only slightly affected by placing the base contact 36 on collector layer 14 as shown in FIG. 8.

In a second preferred embodiment, a perspective view of which is shown in FIG. 9, the base contact 36 to emitter 18 leakage path at the isolation implant boundary 24 must traverse an insulating layer 40. This insulating layer may be composed of, for example, $Si_3N_4$ or $SiO_2$. In this embodiment, the second active region is defined where base contact metal 36 transitions from lying on top of insulating layer 40 to the base layer 16. Thus the second active regions of the first and second embodiments are generally the same, as would be necessary to produce devices with similar performance characteristics. A difference in the embodiments lies in how the leakage path between base contact 36 and emitter 18 along the implant boundary 24 is altered to limit leakage current.

Figure 5A:
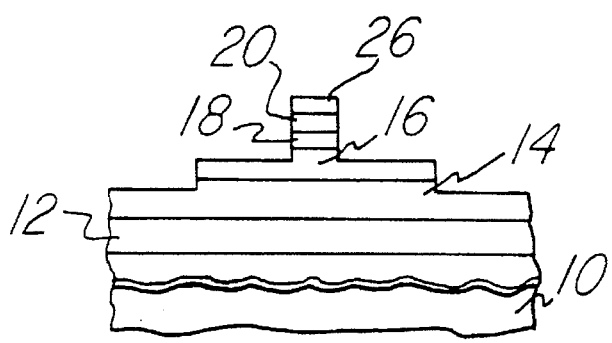
Figure 5B:
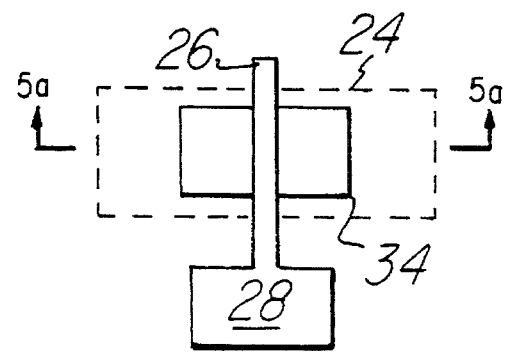

Insulating layer 40 is incorporated into the second preferred embodiment structure by a process similar to that used for the first preferred embodiment, except that after the base mesa is formed as shown in FIGS. 5a and 5b, photoresist 32 is retained. Dielectric layer 40 is then deposited to cover all areas not covered by photoresist 32. Photoresist 32 is then removed, leaving an opening (34 in FIG. 5b) with all areas outside of the boundary 34 covered by the dielectric. Metallization for base contact 36 and base pad 38 is then deposited. All dielectric not covered by base metallization is then removed, resulting in the structure shown in perspective in FIG. 9. Contact to subcollector layer 12 is achieved using standard etch and metallization techniques.

In the preferred embodiments discussed above, the base-emitter leakage problem is addressed with minimal change to a standard process. The first preferred embodiment requires only an additional dry etch step to define the second active region mesa, while the second preferred embodiment requires only the deposition of an insulating layer before base metal deposition.

A few preferred embodiments have been described in detail hereinabove. It is to be understood that the scope of the invention also comprehends embodiments different from that described, yet within the scope of the claims.

Internal and external connections can be ohmic, capacitive, direct or indirect, via intervening circuits or otherwise. Implementation is contemplated in discrete components or fully integrated circuits in gallium arsenide, and other electronic materials families, as well as in optical-based or other technology-based forms and embodiments. For example, GaInP may be substituted for AlGaAs in forming the emitter and/or collector layers of the preferred embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for reducing base-to-emitter leakage in a bipolar transistor having an active region bounded by an isolation implant boundary, said method comprising:

forming an emitter contact over an emitter layer, wherein at a crossing of said implant boundary said emitter contact lies on a first layer; and forming a base contact on a base layer within said implant boundary and on a second layer at a crossing of said implant boundary such that at a crossing of said contacts over said implant boundary, a leakage current between said emitter layer and said base contact along said boundary is limited by a necessity to transit the thickness of a layer of material.

2. The method of claim 1 wherein said layer of material is a base layer.

3. The method of claim 2 wherein said base layer is comprised of GaAs.

4. The method of claim 1 wherein said second layer is a layer of insulating material.

5. The method of claim 4 wherein said insulating material is selected from a group consisting of $Si_3N_4$ and $SiO_2$.

6. The method of claim 1 wherein said bipolar transistor is a heterojunction bipolar transistor.

7. The method of claim 6 wherein said heterojunction bipolar transistor comprises an emitter layer of AlGaAs.

8. The method of claim 6 wherein said heterojunction bipolar transistor comprises an emitter layer of GaInP.

9. A bipolar transistor comprising:
   a. a material structure comprising:
      a collector layer:
      a base layer;
      an emitter layer;
   b. a first active region created in said material structure by ion implanting to convert regions of semiconducting material outside of said first active region to substantially insulating material;
   c. an emitter contact comprising a strip of metallization deposited over said emitter layer, said base layer, and said collector layer, said contact crossing over a boundary of said first active region;
   d. a second active region created within said first active region by removing portions of said emitter layer from areas not covered by said emitter metallization, and then by removing portions of said base layer from areas except those covered by said emitter metallization and in an area within said first active region, said area defining the boundary of said second active region; and
   e. a base contact comprising a strip of metallization deposited on said base layer within said second active region and on said collector layer outside of said second active region, wherein leakage current from said base contact to said emitter layer along said boundary of said first active region is limited by a necessity to transit the thickness of said base layer.

10. The bipolar transistor of claim 9 wherein said collector layer and said base layer are of GaAs and said emitter layer is of AlGaAs.

11. The bipolar transistor of claim 9 wherein said collector layer and said base layer are of GaAs and said emitter layer is of GaInP.

12. The bipolar transistor of claim 9 wherein said collector layer is of GaInP.

13. A bipolar transistor comprising:
   a. a material structure comprising:
      a collector layer;
      a base layer;
      an emitter layer;
   b. a first active region created in said material structure by ion implanting to convert regions of semiconducting material outside of said first active region to substantially insulating material;
   c. an emitter contact lying primarily within, but also crossing a boundary of said first active region, wherein said emitter contact comprises a strip of metallization deposited over said emitter layer, said base layer, and said collector layer, but not over a layer of insulative material;
   d. a second active region lying within said first active region; and
   e. a base contact lying primarily within, but also having a crossing of said boundary of said first active region, wherein said base contact comprises a strip of metallization deposited on said base layer within said second active region and on a layer of insulative material outside of said second active region, said layer of insulative material lying generally only beneath said base contact.

14. The bipolar transistor of claim 13 wherein said collector layer and said base layer are of GaAs and said emitter layer is of AlGaAs.

15. The bipolar transistor of claim 13 wherein said collector layer and said base layer are of GaAs and said emitter layer is of GaInP.

16. The bipolar transistor of claim 13 wherein said collector layer is of GaInP.

* * * * *